(12) United States Patent
Ishikawa

(10) Patent No.: US 6,913,525 B2
(45) Date of Patent: Jul. 5, 2005

(54) CMP DEVICE AND PRODUCTION METHOD FOR SEMICONDUCTOR DEVICE

(75) Inventor: Akira Ishikawa, Kawasaki (JP)

(73) Assignee: Nikon Corporation, Tokyo (JP)

( * ) Notice: Subject to any disclaimer, the term of this patent is extended or adjusted under 35 U.S.C. 154(b) by 50 days.

(21) Appl. No.: 10/333,137

(22) PCT Filed: Jul. 27, 2001

(86) PCT No.: PCT/JP01/06480
§ 371 (c)(1),
(2), (4) Date: Jan. 16, 2003

(87) PCT Pub. No.: WO02/16079
PCT Pub. Date: Feb. 28, 2002

(65) Prior Publication Data
US 2004/0009637 A1 Jan. 15, 2004

(30) Foreign Application Priority Data
Aug. 22, 2000 (JP) .......................... 2000-251049
Jun. 19, 2001 (JP) .......................... 2001-184996

(51) Int. Cl.$^7$ .............................. B24B 7/00; B24B 9/00
(52) U.S. Cl. ........................ 451/174; 451/285; 451/287; 451/290
(58) Field of Search .............................. 451/36, 41, 59, 451/60, 162, 163, 174, 283, 286, 287, 288, 289, 290

(56) References Cited

U.S. PATENT DOCUMENTS 5,800,253 A * 9/1998 Ikemoto ...................... 451/63
5,931,722 A * 8/1999 Ohmi et al. ................. 451/271
5,975,997 A   11/1999 Minami ....................... 451/287
6,106,369 A * 8/2000 Konishi et al. ............... 451/41
6,159,080 A * 12/2000 Talieh .......................... 451/41
6,270,392 B1 * 8/2001 Hayashi et al. ............... 451/5
6,299,506 B2 * 10/2001 Nishimura et al. ............ 451/8
6,602,121 B1 * 8/2003 Halley ........................ 451/287

FOREIGN PATENT DOCUMENTS

| JP | 10-015810 | 1/1998 |
| JP | 10-180622 | 7/1998 |
| JP | 2000-757  | 1/2000 |

* cited by examiner

Primary Examiner—Timothy V. Eley
(74) Attorney, Agent, or Firm—Morgan, Lewis & Bockius LLP

(57) ABSTRACT

A triangular pad of the type shown in FIG. 5(a) which has circular tip ends is used as the polishing pad. This shape corresponds to the concept of partially cutting the outer edge of the polishing pad in order to shorten the contact time of the polishing pad and wafer at the outer circumference of the wafer regardless of the swing speed. As shown in the figure, a circular bored part with a diameter of 50 mm is provided in the center of such a polishing pad. By using this polishing pad and dividing the swing width into ten, it is possible to keep the product of the integrated value of the relative linear velocity, the integrated value of the pressure, and the integrated value of the contact time at various points within the wafer surface within ±30% of the mean value in each swing width under feasible swing conditions. Thus, the use of such a polishing pad makes it possible to perform uniform polishing.

7 Claims, 14 Drawing Sheets

(a)

(b)

PRIOR ART

CM P DEVICE AND PRODUCTION METHOD FOR SEMICONDUCTOR DEVICE

TECHNICAL FIELD

The present invention relates to a CMP apparatus (chemical mechanical polishing apparatus) in which both chemical polishing and mechanical polishing are performed by causing relative movement of a polishing pad and an object of polishing while supplying a polishing agent (slurry) between the polishing pad and the object of polishing.

BACKGROUND ART

In universally known CMP apparatuses (Japanese Patent Application Kokai No. H6-21028, Japanese Patent Application Kokai No. H7-266219, Japanese Patent Application Kokai No. H8-192353, Japanese Patent Application Kokai No. H8-293477, Japanese Patent Application Kokai No. H10-173715, Japanese Patent Application Kokai No. H11-156711 and British Laid-Open Patent No. 2331948, etc.), an object of polishing is polished by supporting a surface plate on which a polishing pad is pasted on a spindle shaft, causing this surface plate to rotate, rotating the object of polishing that is held on a chuck that faces this, pressing the object of polishing that is held on a chuck against the surface of the polishing pad while supplying a polishing agent (slurry) to this surface, causing the pad and object of polishing to rotate in the same direction or in opposite directions in relative terms, and swinging the polishing pad.

Polishing pad materials that are used include hard foam urethane sheets, polyester fiber nonwoven fabrics, felt, polyvinyl alcohol fiber nonwoven fabrics, nylon fiber nonwoven fabrics, and materials in which a foaming urethane resin solution is flow-spread on such nonwoven fabrics, and is then foamed and hardened, etc.

Conventionally, the polishing pad shape has been circular, like the shape of the substrate that is being polished, and pads with a thickness of 3 to 7 mm have been used in a configuration in which these pads are pasted to a surface plate such as an aluminum plate or stainless steel plate.

Furthermore, pads that are larger than the object of polishing have been used as polishing pads in the past; however, for reasons such as the difficulty in uniform polishing caused by the increased difference between the peripheral speed in the outer portion and the peripheral speed in the central portion, and the difficulty in high-speed rotation of a surface plate that has large dimensions, so-called small-diameter pads, which have a smaller size than that of an object of polishing, have come to be used recently.

Generally, a Preston's equation such as the one shown below is used as an equation for determining the amount of polishing:

$$V = n \cdot P \cdot v \cdot t$$

Here, V is the polishing speed, n is a constant, P is the contact pressure of the polishing pad and object of polishing, v is the relative linear velocity of the polishing pad and object of polishing, and t is the contact time of the polishing pad and object of polishing. In order to perform uniform polishing, the polishing speed determined by V must be more or less the same at each point of the object of polishing.

In the case of a polishing system using a small-diameter pad, a portion of the object of polishing is polished at any given moment, so that a polishing method is used under swing conditions in which the polishing pad overhangs from the object of polishing in order to ensure high-speed polishing and polishing uniformity.

However, when the polishing pad overhangs from the object of polishing, the contact area between the polishing pad and object of polishing fluctuates due to swinging, so that the load per unit area fluctuates. Furthermore, in cases where the diaphragm system of a pressure mechanism is used, inclination of the polishing pad and fluctuation of the load occur due to the overhang from the object of polishing. As a result, the product of the integrated value of the load and the integrated value of the relative linear velocity during the polishing time does not show the same value at various points within the surface of the object of polishing. In other words, polishing is performed unevenly.

Therefore, to keep this value the same, a method is employed in which the swing speed is varied according to the swing position (adjustment is made according to the contact time between the object of polishing and polishing pad), or the load is controlled so as to be constant.

[Problems to be Solved by the Invention]

However, in cases where the swing speed is varied according to the swing position, the following problems are encountered: specifically, the conditions of varying the speed to achieve the uniform polishing become complex, and the machinery cannot catch up with the command speed determined. Furthermore, in cases where the pressure is controlled according to the swing position so that the load per unit area is constant, the problem is that there may be delay in control due to the compression of the fluid, etc., used for pressurization. Because of these problems, it is difficult to uniformly polish objects of polishing in a polishing apparatus using a small-diameter pad.

DISCLOSURE OF THE INVENTION

The present invention was devised in light of such facts, and the object of the present invention is to provide a CMP apparatus capable of uniformly polishing an object of polishing even in cases where a small-diameter pad is used, and a semiconductor device manufacturing method utilizing this CMP apparatus.

The first invention that is used to achieve the above-mentioned object is a CMP apparatus (chemical mechanical polishing apparatus) which performs polishing by pressing a polishing pad that is smaller than the object of polishing against the object of polishing in relative terms and by swinging the polishing pad while rotating both the object of polishing and the polishing pad so that relative movement occurs between these two parts, wherein this CMP apparatus comprises a polishing pad whose shape is such that in all points on the surface of the object of polishing, the product of three values—i.e., the integrated value of the relative linear velocity, the integrated value of the pressure, and the integrated value of the contact time—of the polishing pad and object of polishing during the polishing time is within ±30% of the mean value of the product of these three integrated values at all points on the surface of the object of polishing.

In the present invention, as a result of the design of the polishing pad shape, the product of the three elements in the above-mentioned Preston's equation is maintained within a specified range over the entire surface of the object of polishing. Specifically, a polishing pad is used which has a shape such that in all points on the surface of the object of polishing, the product of three values—i.e., the integrated value of the relative linear velocity, the integrated value of the pressure, and the integrated value of the contact time—of the polishing pad and object of polishing during the polishing time is within ±30% of the mean value of the product of these three integrated values at all points on the surface of the object of polishing.

The shape of such a polishing pad changes according to the ratio of the polishing pad to the object of polishing and the swing range of the polishing pad, etc., and the present invention is realized generally by making this shape so that the contact time of the object of polishing and polishing pad is shortened toward the outer circumferential portion of the polishing pad by cutting the outer circumferential portion of the polishing pad, where the peripheral speed is faster. The reason that the range of dispersion of the above-mentioned product of the three integrated values is kept within ±30% of the mean value is that it has been found as a result of experiments by the inventors that if this dispersion is kept within this range, the uniform polishing of a silicon wafer is possible in a range that does not cause practical problems in a CMP apparatus.

In the present invention, since the shape of the polishing pad is such that the above-mentioned conditions are satisfied, there is no need to perform complicated swinging, and swinging in a range that allows the machinery to catch up is sufficient; accordingly, it is possible to perform uniform polishing over the entire surface of the object of polishing. The symmetry of the external shape of the polishing pad is not absolutely necessary.

The second invention that is used to achieve the above-mentioned object is the above-mentioned first invention, wherein at least one bored part is provided in the polishing pad.

It is preferable that the bored part be provided in the central portion, where the peripheral speed of rotation is slow. By doing so, polishing is not performed in the area where the peripheral speed of rotation is slow, which reduces the distribution of the relative speed of the polishing pad and the member to be polished in various parts that contact the polishing pad, which in turn makes it easier to satisfy the conditions in the above-mentioned first invention. The symmetry of the bored shape is not absolutely necessary. Furthermore, the position of the bored part does not have to be symmetrical to the center of the external shape of the polishing pad or the center of rotation of the rotating surface plate to which the polishing pad is fixed.

The third invention that is used to achieve the above-mentioned object is the above-mentioned second invention, wherein the area of the bored part is 80% or less of the total area of the pad.

In the second invention, if the area of the bored part is excessively large, not only can the uniformity of polishing not maintained even more, but also the polishing efficiency deteriorates. According to the experiments by the inventors, if this area exceeds 80%, these characteristics rapidly deteriorate, so that the area is limited to 80% or less.

The fourth invention that is used to achieve the above-mentioned object is the above-mentioned second invention or third invention, wherein a mechanism for supplying a slurry from the bored part is provided.

A slurry that constitutes the polishing agent is supplied between the polishing pad and object of polishing in a CMP apparatus; however, if the slurry is supplied from the outside of the polishing pad, the slurry is scattered due to the centrifugal force accompanied by the rotation of the object of polishing, so that there are cases in which the slurry does not enter between the polishing pad and object of polishing very well. In the present invention, since the slurry is supplied from the bored part in the polishing pad, this polishing agent is supplied between the polishing pad and the object of polishing without scattering.

The fifth invention that is used to achieve the above-mentioned object is any of the above-mentioned second invention through fourth invention, wherein the shape of the above-mentioned bored part is a shape other than a circle.

In the present invention, the location of the boundary between the bored part and the remaining parts changes with the rotation of the polishing pad even in cases where the center of rotation of the polishing pad coincides with the bored part; accordingly, it is possible to prevent polishing at the boundary portion from becoming non-uniform.

The sixth invention that is used to achieve the above-mentioned object is the above-mentioned first invention, wherein a circular bored part is provided in the center of the polishing pad, and when the radius of this bored part is r, the length of the effective part of the polishing pad on the circumference in the specified distance from the center of the above-mentioned polishing pad is in the range of 0.5 $\pi$r to 4 $\pi$r, excluding the end parts of the above-mentioned polishing pad.

Here, the "end parts" refer to the areas that are located within a distance of 5 mm from the corner parts of the member forming the polishing pad, or the areas that are located within a distance of 5 mm from the vertices of a polygonal shape that is formed by extending the lines forming the edge parts of the polishing pad.

In the present invention, since the shape of the polishing pad satisfies such a condition, there is no need to perform complicated swinging, and swinging within a range that allows the machinery to catch up is sufficient. Accordingly, it is possible to perform uniform polishing over the entire surface of the object of polishing. The symmetry of the external shape of the polishing pad is not absolutely necessary.

In contrast, when the length of the effective part of the polishing pad in the specified distance from the center of the above-mentioned polishing pad is not in the range of 0.5 $\pi$r to 4 $\pi$r, complex swinging must be performed, so that the machinery cannot catch up. Furthermore, the reason that this condition is excluded in the above-mentioned end parts is that the ratio of the end parts contributing to polishing is small, so that these parts can be ignored.

The seventh invention that is used to achieve the above-mentioned object is any of the above-mentioned first invention through sixth invention, wherein the center of the external shape of the polishing pad and the center of rotation of the surface plate to which the polishing pad is pasted are shifted.

If the center of the external shape of the polishing pad and the center of rotation of the surface plate to which the polishing pad is pasted coincide with each other, the outer circumferential portion of the polishing pad always rotates in a state in which the linear velocity is fast, while the central portion always rotates in a state in which the linear velocity is slow. Accordingly, the difference in linear velocity is increased, which is undesirable. Furthermore, in cases where the bored part is provided in the central portion of the pad in the above-mentioned second invention, a discontinuous part emerges between the bored part and non-bored part at the end parts of swinging; as a result, polishing may become non-uniform.

In the present invention, since the center of the external shape of the polishing pad and the center of rotation of the surface plate to which the polishing pad is pasted are shifted, the difference in linear velocity within the polishing pad is reduced, so that the amount of polishing of the object of polishing can be made even more uniform. Moreover, since complex swinging is practically applied, it is possible to prevent the occurrence of the discontinuous part between the bored part and non-bored part in the end parts of swinging even in cases where the central part of the polishing pad is bored through.

The eighth invention that is used to achieve the above-mentioned object is a semiconductor device manufacturing method comprising a process in which a wafer is polished using the CMP apparatus of any of the above-mentioned first invention through seventh invention.

In the present invention, polishing of a wafer can be performed with a high degree of uniformity, so that semiconductor devices that have a fine line width can be manufactured with a good yield.

BEST MODE FOR CARRYING OUT THE INVENTION

Preferred embodiments of the present invention will be described below using the figures. However, the scope of the present invention is not limited by the embodiments described.

Figure 1:
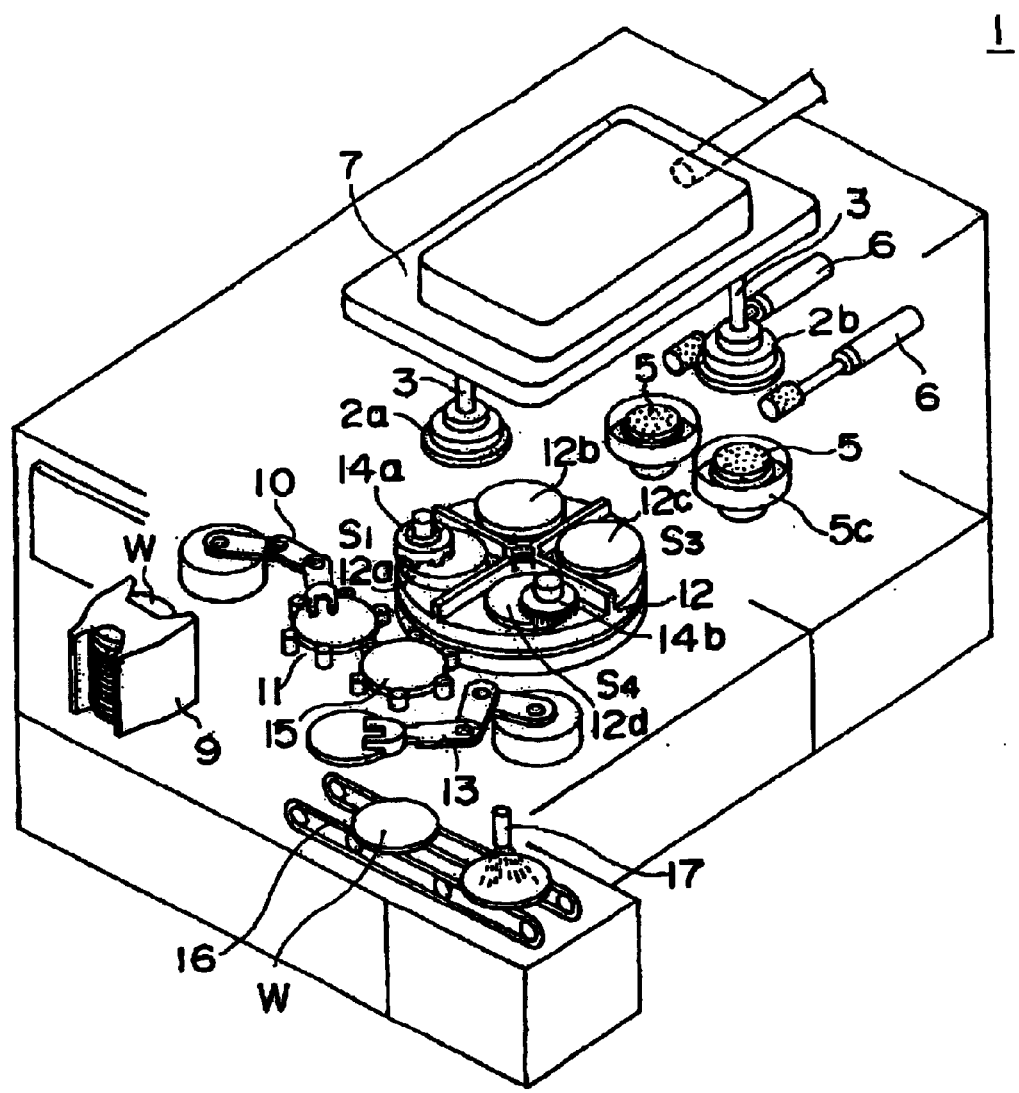
FIG. 1 is a perspective view showing one example of the CMP apparatus that constitutes an embodiment of the present invention.
Figure 2:
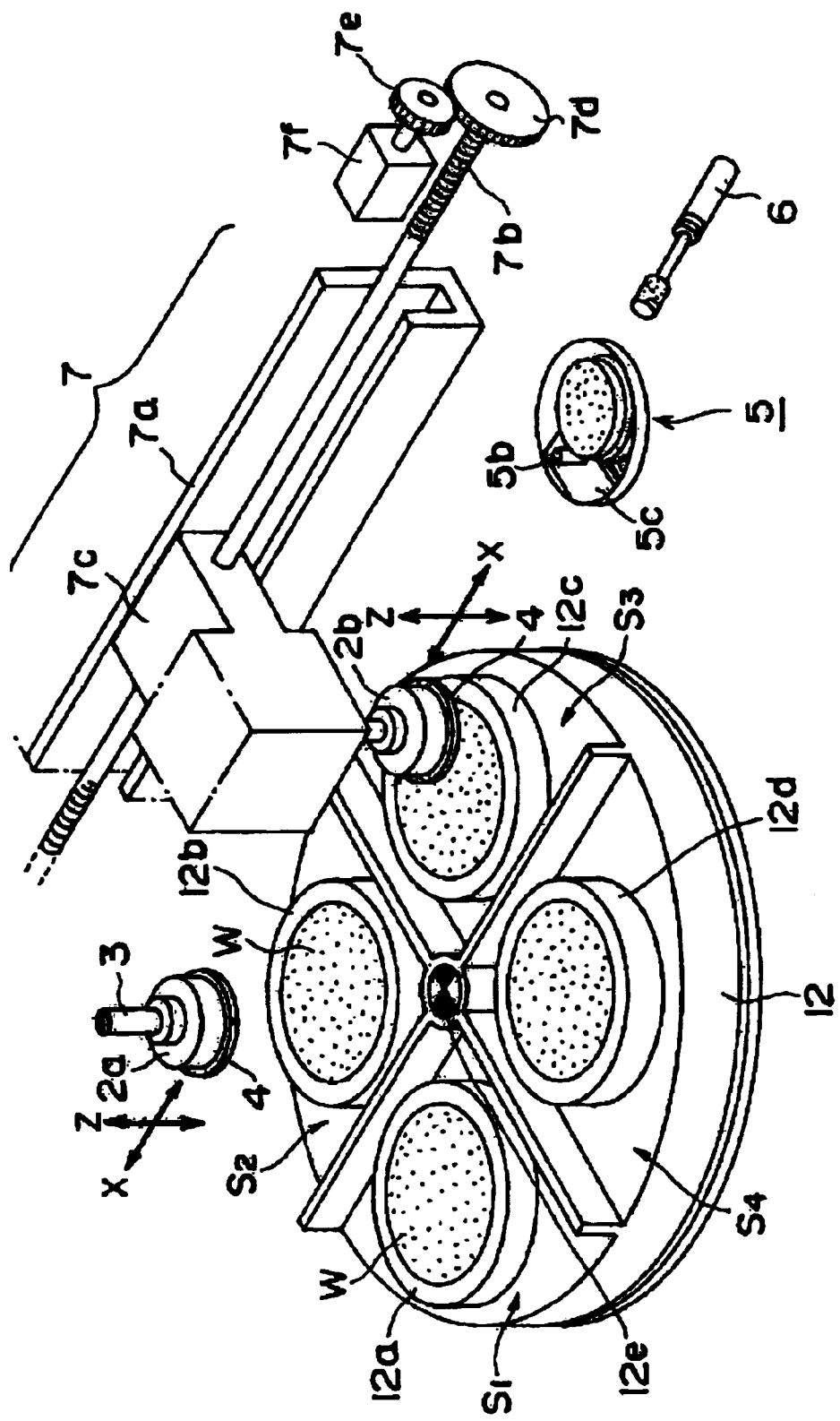
FIG. 2 is a perspective view showing a feeding mechanism of the polishing pad.
Figure 3A:
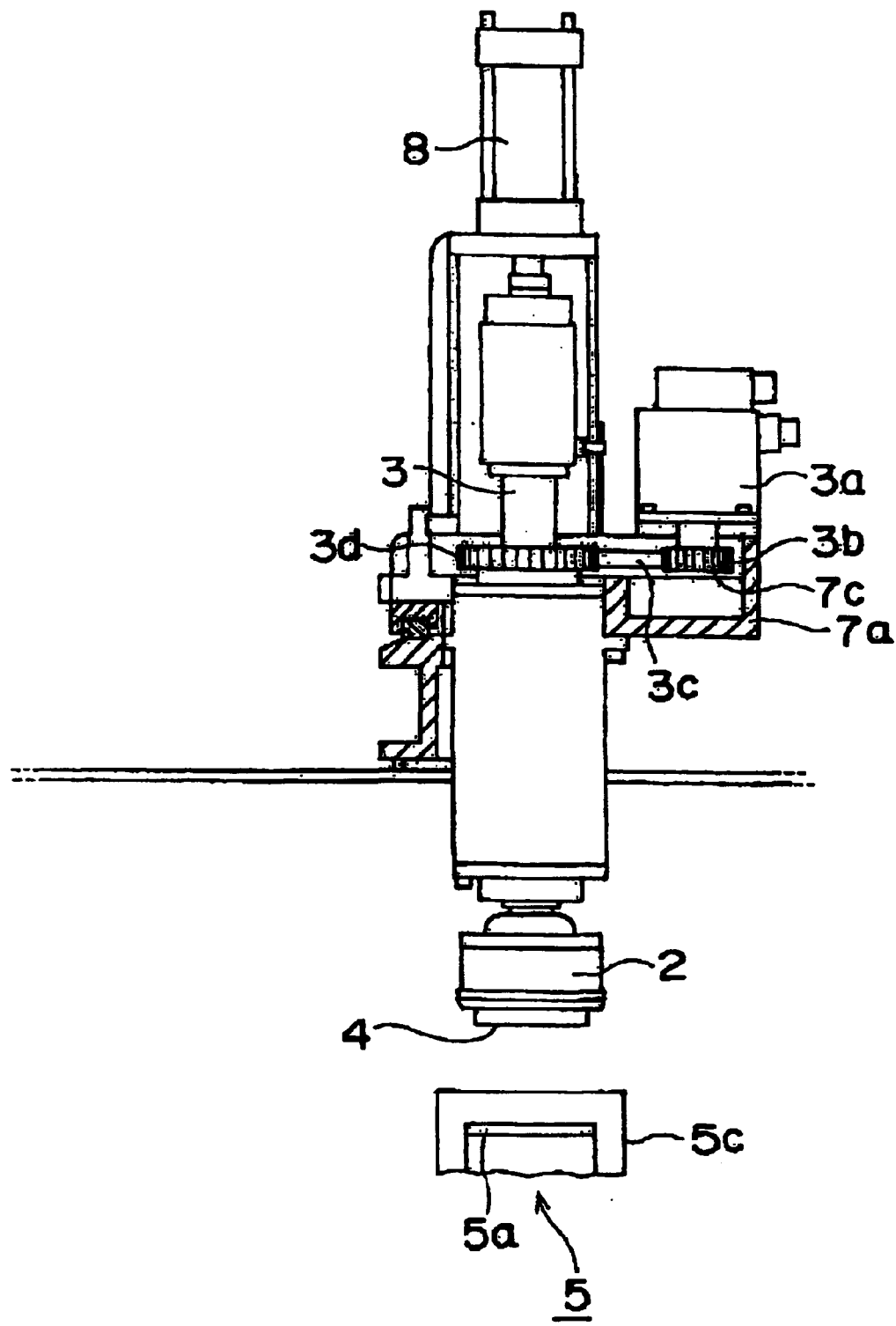
FIG. 3A is a partial sectional view of a concentric polishing pad and conditioning device.
Figure 3B:
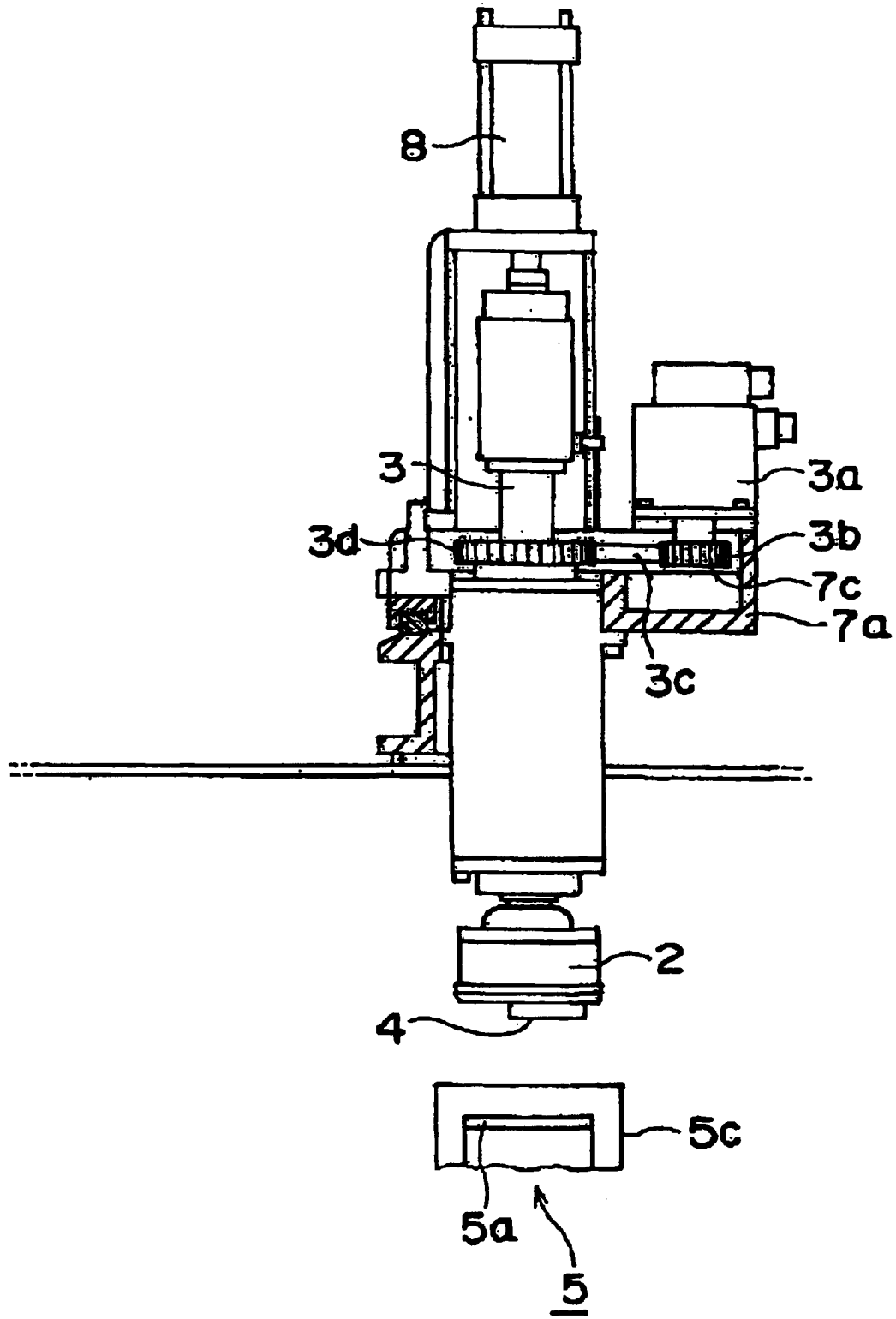
FIG. 3B is a partial sectional view of an ecentric polishing pad and conditioning device.
Figure 4:
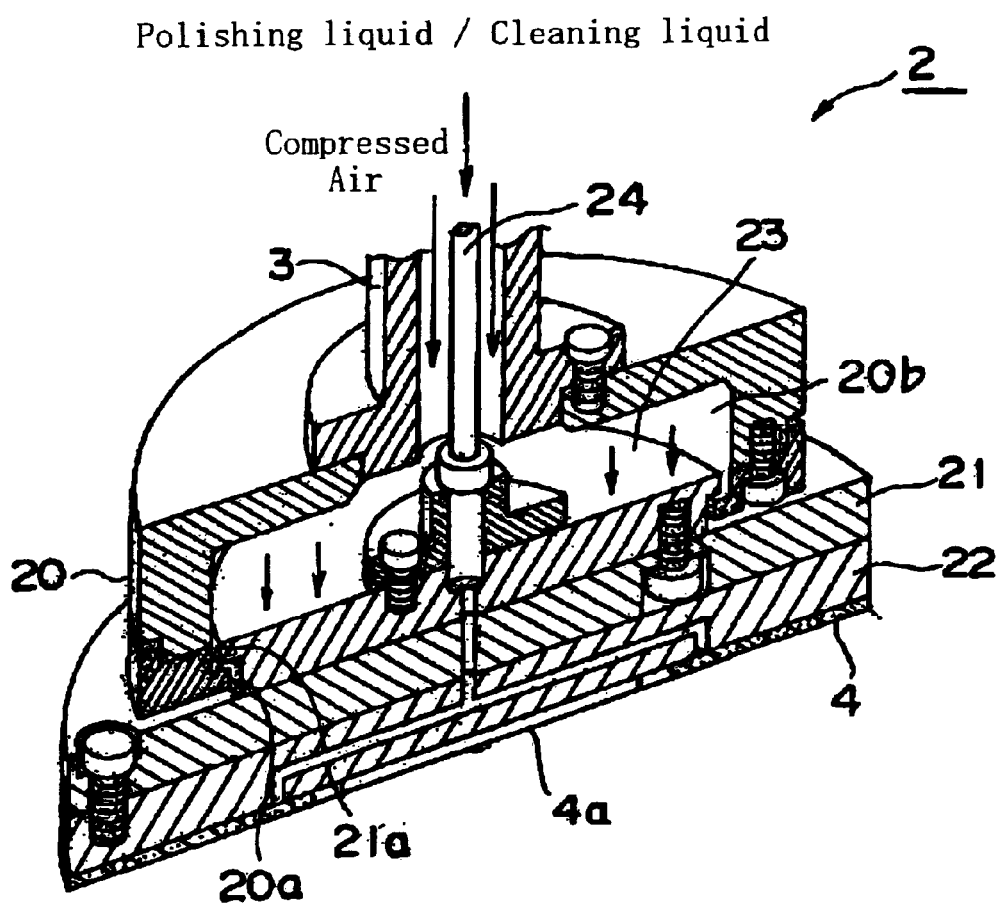
FIG. 4 is a sectional view of the polishing head.

FIG. 1 is a perspective view showing one example of the CMP apparatus constituting an embodiment of the present invention. FIG. 2 is a perspective view showing a feeding mechanism of the polishing pad. FIG. 3 is a partial sectional view of the polishing pad and the conditioning device. FIG. 4 is a sectional view of the polishing head.

In the indexing-type CMP apparatus 1 shown in FIGS. 1, 2 and 3A and 3B, 2 indicates a polishing head, 2a indicates a polishing head used for rough polishing, 2b indicates a polishing head used for finishing polishing, 3 indicates a rotating shaft, 3a indicates a motor, 3b indicates a gear, 3c indicates a pulley, 3d indicates a gear, 4 indicates polishing pads, 5 indicates pad conditioning mechanisms, 5a indicates a dressing disk, 5b indicates a spray nozzle, 5c indicates a protective cover, 6 indicates rotatable cleaning brushes, 7 indicates a feeding mechanism for the polishing head, 7a indicates a rail, 7b indicates a feed screw, and 7c indicates a moving body which is screw-mounted on the feed screw, with the polishing head being held on this moving body.

7d and 7e indicate gears, 7f indicates a motor, 8 indicates an air cylinder constituting a head raising-and-lowering mechanism, 9 indicates a cassette that accommodates wafers W, 10 indicates a loading-conveying robot, and 11 indicates a wafer temporary placement stand. 12 indicates an indexing table which has four rotatable wafer chucking mechanisms 12a, 12b, 12c and 12d installed at equal intervals on the same circle centered on a shaft 12e; this indexing table 12 is divided into a wafer loading zone s1, a rough polishing zone s2, a wafer finishing polishing zone s3, and a wafer unloading zone s4.

13 indicates an unloading-conveying robot, 14a indicates a chuck dresser, 14b indicates a chuck cleaning mechanism, 15 indicates a wafer temporary placement stand, 16 indicates a belt conveyor, and 17 indicates a wafer cleaning mechanism.

In the polishing head 2 shown in FIG. 4, the polishing head 2 is devised so that the protruding edge 21a of the substrate 21 is supported on the flange part 20a of a pressurizing cylinder 20, and the polishing pad (annular polishing cloth) 4 is held on the substrate 21 via a polishing cloth attachment plate 22. A diaphragm 23 is installed inside the pressurizing chamber 20b of the pressurizing cylinder 20, and compressed air is pressure-fed into the interior of the pressurizing chamber 20b via the interior of the spindle shaft 3. The substrate 21 is supported by this pressure so that the substrate 21 is free to swing in three dimensions (X, Y and Z), and the polishing pad 4 is held parallel to the surface of the wafer.

A supply pipe 24 for the polishing liquid or cleaning liquid is installed in the center of the head 2, and the tip end of this pipe 24 faces the back surface of the annular body of the polishing pad (while avoiding the central bored part 4a of the polishing pad 4), so that the polishing liquid is supplied to the surface of the substrate via the annular body. Furthermore, instead of using this configuration, the pipe may be configured so that the polishing liquid is supplied to the interior of the central bored part 4a of the polishing pad 4.

A hard foam urethane sheet, polyester fiber nonwoven fabric, felt, polyvinyl alcohol fiber nonwoven fabric, nylon fiber nonwoven fabric, or a material in which a urethane resin solution is flow-spread on such a nonwoven fabric and is then foamed and hardened, etc., is used as the polishing pad material. The thickness of the pad is 1 to 7 mm. Furthermore, laminates of the above-mentioned materials may also be utilized.

A slurry which contains the following materials is used as the polishing agent liquid: (a) solid abrasive grains of colloidal alumina, fumed silica, cerium oxide or titania, etc., at the rate of 0.01 to 20 wt %, (b) an oxidizing agent such as copper nitrate, iron citrate, manganese peroxide, ethylenediaminetetraacetic acid, hexacynao-iron, hydrofluoric acid, fluorotitanic acid, dipersulfate, ammonium fluoride, ammonium hydrogen difluoride, ammonium persulfate or hydrogen peroxide at the rate of 1 to 15 wt %, (c) a surfactant at the rate of 0.3 to 3 wt %, (d) a pH adjusting agent, and (e) a preservative, etc. (this is described in Japanese Patent Application Kokai No. H6-313164, Japanese Patent Application Kokai No. H8-197414, Japanese Patent Application Tokuhyo No. H8-510437, Japanese Patent Application Kokai No. H10-67986, and Japanese Patent Application Kokai No. H10-226784, etc.).

Polishing agent slurries that are suitable for the polishing of metals such as copper, copper-titanium, copper-tungsten and titanium-aluminum can be obtained from Fujimi Incorporated, Rodel Nitta Company, Cabot Corporation (U.S.A.) and Rodel, Inc. (U.S.A.).

The process whereby a wafer that has a metal film on top of an insulating layer is polished using the above-mentioned CMP apparatus is performed as follows:

1) The wafer w1 (although the wafer is shown as W in the figures, the first wafer is referred to as w1, the second wafer is referred to as w2, and so forth) is removed from the cassette 9 by the arm of the conveying robot 10 and is placed on the temporary placement stand 11 with the metal film surface facing upward. Here, the back surface of the wafer is cleaned, and the wafer is then conveyed into the wafer loading zone s1 of the indexing table 12 by the conveying robot, and is suction-chucked by the chucking mechanism 12a.

2) The indexing table 12 is caused to rotate 90 degrees in the clockwise direction, so that the wafer w1 is conducted into the first polishing zone s2. The spindle shaft 3 is lowered so that the polishing pad 4 attached to the head 2a is pressed against the wafer w1, and chemical mechanical polishing of the wafer is performed by causing the spindle shaft 3 and the shaft of the chucking mechanism to rotate. During this period, a new wafer w2 is placed on the temporary placement stand, and is conveyed into the wafer loading zone s1 and suction-chucked by the chucking mechanism 12b.

During CMP working, the polishing pad is caused to perform a reciprocating swinging motion in the left-right direction (the direction of the X axis) by means of a ball screw from the center point of the wafer. The reciprocating swinging motion of the polishing pad is set so that in a case where the swing speed of the polishing pad when the outer circumference of the polishing pad is positioned between the center point and outer circumference of the wafer is taken as the reference speed, the swing speed of the polishing pad in the vicinity of the center point of the wafer is slowed, and the swing speed in the outer circumferential portion of the wafer is accelerated, so that dishing is evened out.

When chemical mechanical polishing in the first polishing zone s2 has been performed for a desired period of time, the spindle shaft 3 is raised and retracted to the right, and is conducted onto a pad cleaning mechanism 5. Here, abrasive grains and metal polishing debris adhering to the pad surface are removed by a rotating brush 6 while a high-pressure jet of water is caused to jet from a nozzle 5b. Then, the polishing pad is again conveyed to the left, and is caused to wait in the polishing zone s2.

3) The indexing table is caused to rotate 90 degrees in the clockwise direction, so that the polished wafer w1 is conducted into the second polishing zone s3. Then, the spindle shaft 3 is lowered so that the polishing pad 4 attached to the head 2b is pressed against the roughly polished wafer w1, and finishing chemical mechanical polishing of the wafer is performed by causing the spindle shaft 3 and the shaft of the chucking mechanism to rotate. After this finishing polishing is completed, the spindle shaft 3 is raised and retracted to the right; the polishing pad attached to the head 2b is cleaned by the cleaning mechanism 5, and is then again conveyed to the left and caused to wait in the second polishing zone s3.

During this period, a new wafer w3 is placed on the temporary placement stand, conveyed into the wafer loading zone s1, and suction-chucked by the chucking mechanism 12c. Furthermore, in the first polishing zone s2, rough chemical mechanical polishing of the wafer w2 is performed.

4) The indexing table 12 is caused to rotate 90 degrees in the clockwise direction, so that the polished wafer w1 is conducted into the unloading zone s4. Next, the wafer that has been subjected to finishing polishing is conveyed to the temporary placement stand 15 by the unloading conveying robot 13, and the back surface of this wafer is cleaned. Afterward, this wafer is conducted by the conveying robot 13 to a conveying mechanism that utilizes a belt conveyor, and a cleaning liquid is blown onto the pattern surface of the polished wafer from a nozzle 17 so that the pattern surface is cleaned; the wafer is then conducted to the next process.

During this period, a new wafer w4 is placed on the temporary placement stand; this wafer is conveyed into the wafer loading zone s1, and is suction-chucked by the chucking mechanism 12b. Furthermore, rough chemical mechanical polishing of the wafer w3 is performed in the first polishing zone s2, and finishing chemical mechanical polishing of the wafer w2 is performed in the second polishing zone s3.

5) The indexing table 12 is caused to rotate 90 degrees in the clockwise direction, after which operations similar to those of the above-mentioned processes 2) through 4) are repeated, so that chemical mechanical polishing of the wafers is performed.

In the above example, the chemical mechanical polishing was divided into a first rough polishing process and a second finishing polishing process in order to shorten the throughput time; however, it would also be possible to perform CMP working in a single stage, or to further shorten the throughput time by dividing the polishing into three stages, i.e., rough polishing, intermediate polishing and finishing polishing. In cases where a three-stage CMP working process is adopted, s1 is used as a zone for both wafer loading and wafer unloading, s2 is used as a first polishing zone, s3 is used as a second polishing zone, and s4 is used as a third polishing zone.

Furthermore, in regard to the polishing pad material, the materials of the first polishing pad and second polishing pad may be varied.

Naturally, the CMP apparatus of the present invention may also be used for the removal of the insulating layer film from a substrate in which an insulating layer film is formed on top of a metal pattern, or for the removal of the P-TEOS film layer from an STI.

(Embodiments)

Preferred Embodiments of the Present Invention will be Described Below.

(Embodiment 1)

Using a CMP apparatus of the type described above, an eight-inch wafer on which a thermal oxidation film had been formed to a thickness of 1 $\mu$m was polished under the following conditions. Polishing was performed in two stages in the above-mentioned CMP apparatus; however, since this is an experiment, polishing in the first polishing zone s2 was not performed, and polishing only in the second polishing zone s3 was performed. The polishing conditions were set as follows:

Pad rpm: 400 rpm
Wafer rpm: −200 rpm (rotation in the opposite direction from the pad)
Load: 200 gf/cm$^2$
Polishing time: 120 sec
Slurry: SS25 by Cabot Corporation diluted 2×, 75 ml/min
Swinging starting position: 25 mm from the center of wafer to the center of polishing pad
Swing width: 40.0 mm from the starting position toward the outer circumference of wafer
Swing speed: speed variable in ten steps, the width of one of the divided parts is 4.0 mm A triangular pad with the circular tip ends as that shown in FIG. 5(a) was used as the polishing pad in this embodiment. (Furthermore, the units of the dimensions of the polishing pad indicated below are mm.) These circular tip ends correspond to the concept in which portions of the outer edge of the polishing pad are cut in order to shorten the contact time of the polishing pad and wafer in the outer circumference of the wafer regardless of the swing speed. As is indicated in the figure, a circular bored part with a diameter of 50 mm is provided in the center of such a polishing pad.

Figure 5:
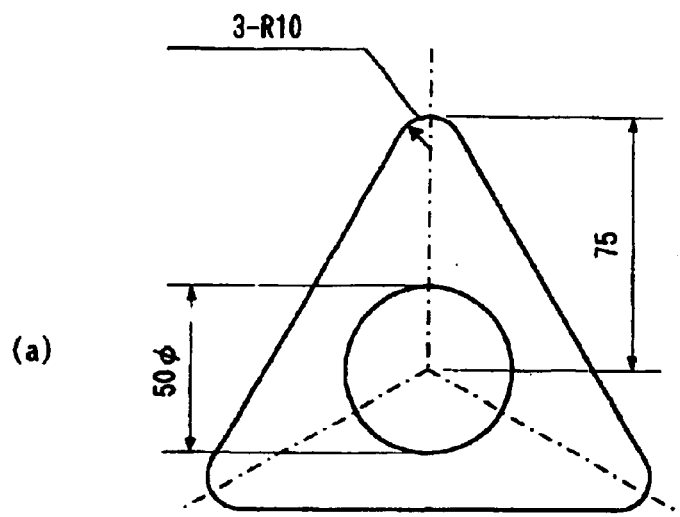
FIG. 5(a) and 5(b) are diagrams showing examples of the polishing pad in an embodiment and in the prior art, respectively.
Figure 5:
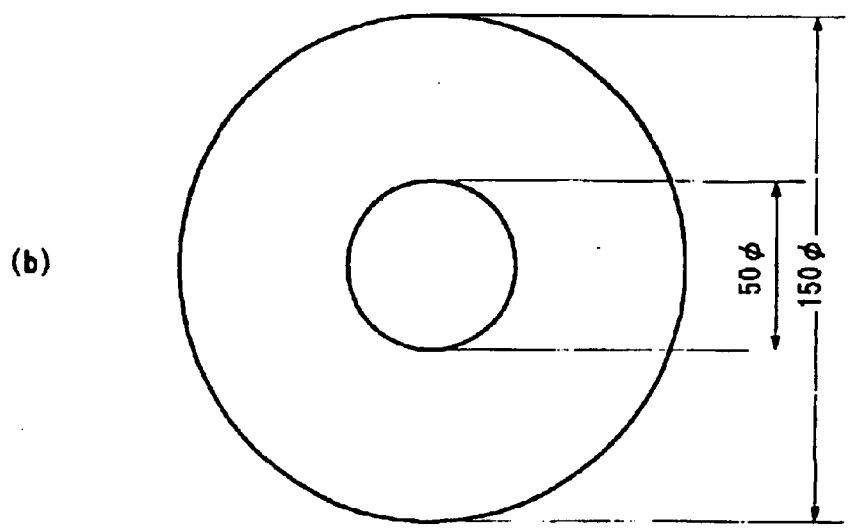

As shown in FIG. 5(b), the prior art shows a circular polishing pad with a diameter of 150 mm in which a circular bored part with a diameter of 50 mm is provided in the center of this polishing pad and is used as the polishing pad for a comparative example.

Figure 6:
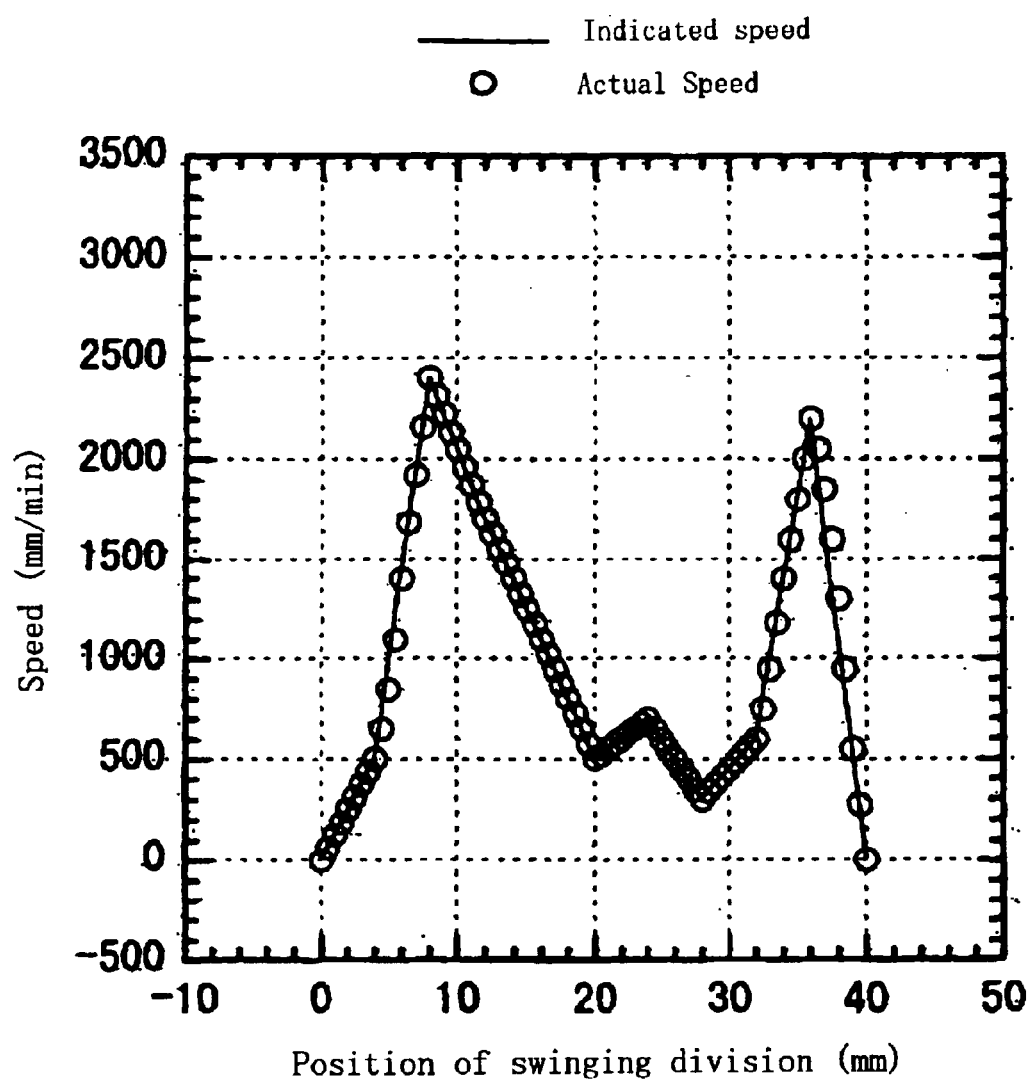
FIG. 6 is a graph showing the swing speed in an embodiment of the present invention.

Using this polishing pad and dividing the swing width into ten, the respective swing speeds at various swing positions are determined by calculations so that the product of the integrated value of the relative linear velocity, the integrated value of the pressure, and the integrated value of the contact time of the polishing pad and object of polishing during the polishing time at various points within the wafer surface in each swing width, is within ±30% of the mean value of the product of these three integrated values at all points on the surface of the object of polishing. FIG. 6 shows the result in the case of the polishing pad shown in FIG. 5(a). In FIG. 6, the solid line indicates the calculated indicated speed, while circles indicate actually obtained speeds. It is seen from this figure that the actually obtained swing speed follows the command value, and that a desired polishing state is obtained.

Figure 7:
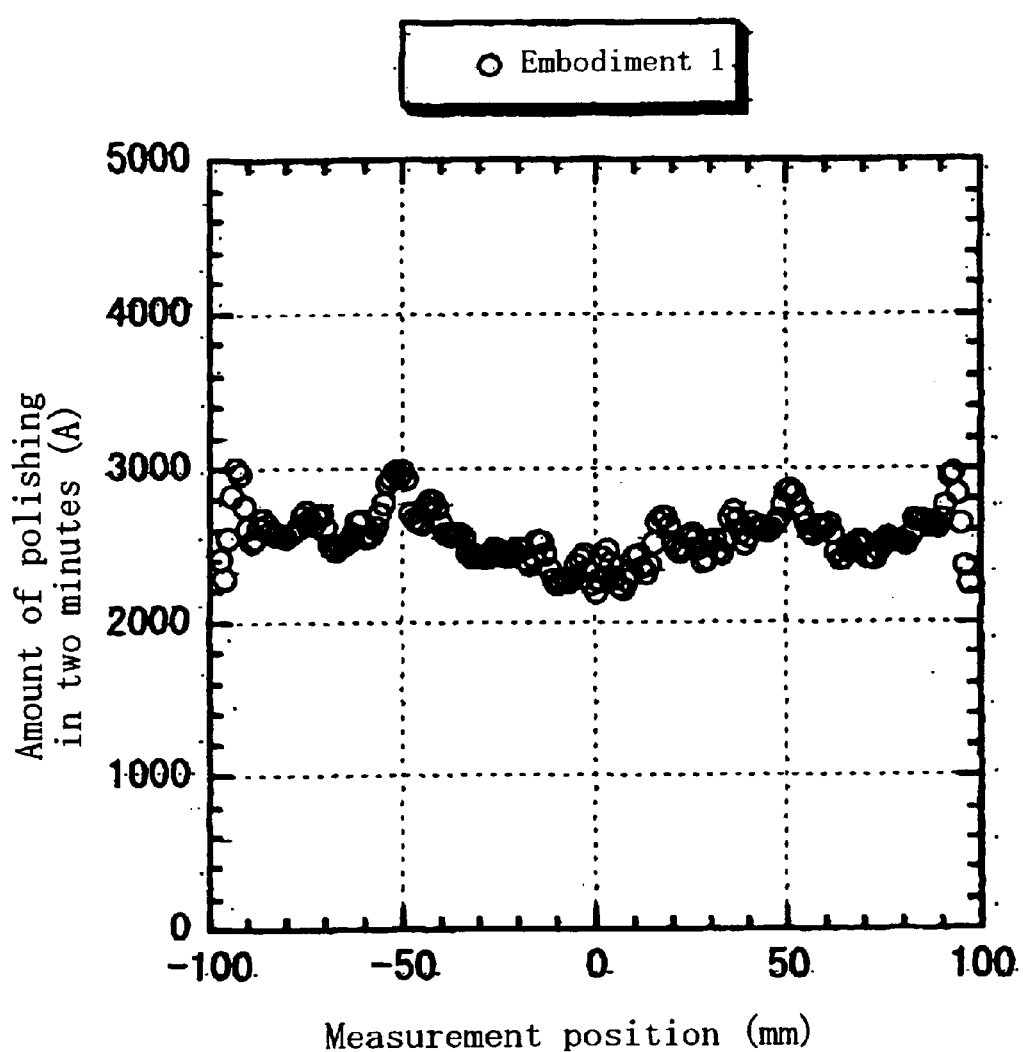
FIG. 7 is a graph showing the result of polishing a wafer in the first embodiment of the present invention.

FIG. 7 shows the amount of polishing (in angstroms) obtained in this polishing. It is apparent from this figure that more or less constant amount of polishing is obtained regardless of the measurement positions. The polishing uniformity (σ) was 12.3%.

Figure 8:
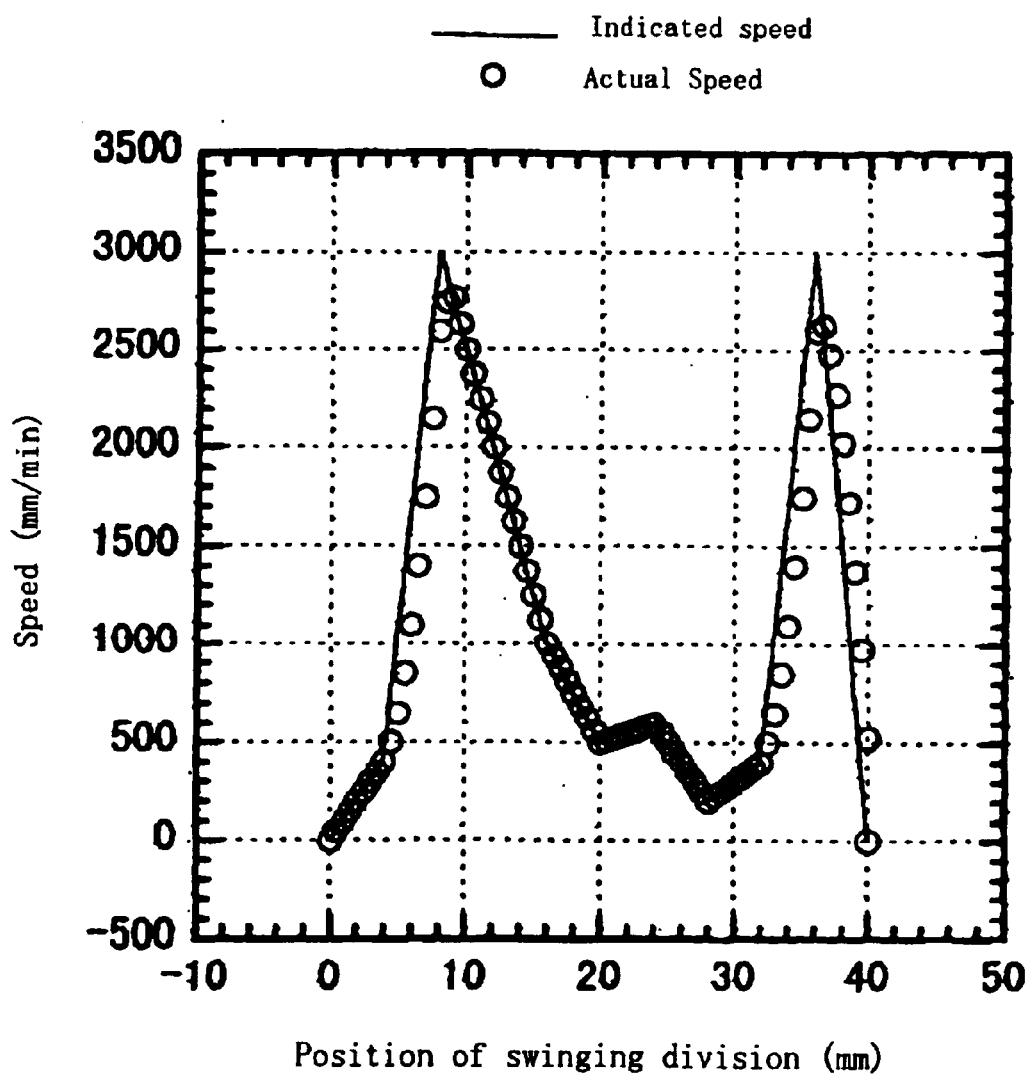
FIG. 8 is a graph showing the swing speed in the prior art.

FIG. 8 shows the result, when the polishing pad of the type shown in FIG. 5(b) is used, and the swing width is divided into ten, in which the respective swing speeds at various swing positions are determined by calculations so that the product of the integrated value of the relative linear velocity, the integrated value of the pressure, and the integrated value of the contact time of the polishing pad and object of polishing during the polishing time at various points within the wafer surface, is within ±30% of the mean value of the product of these three integrated values at all points on the surface of the object of polishing in each swing width.

When FIG. 6 and FIG. 8 are compared, it is seen that the fluctuations in the swing speed are increased in the case of FIG. 8. Furthermore, it is also seen that the actually measured values indicated by the circles do not follow the command values. In other words, in the actual polishing, the following condition is not satisfied; namely, the product of the integrated value of the relative linear velocity, the integrated value of the pressure, and the integrated value of the contact time of the polishing pad and object of polishing during the polishing time at various points within the wafer surface, is within ±30% of the mean value of the product of these three integrated values at all points on the surface of the object of polishing.

In other words, in the prior art polishing pad having the shape such as the one shown in FIG. 5(b), the condition is not satisfied in which, in all points on the surface of the object of polishing, the product of three values—i.e., the integrated value of the relative linear velocity, the integrated value of the pressure, and the integrated value of the contact time—of the polishing pad and object of polishing during the polishing time is within ±30% of the mean value of the product of these three integrated values at all points on the surface of the object of polishing.

Figure 9:
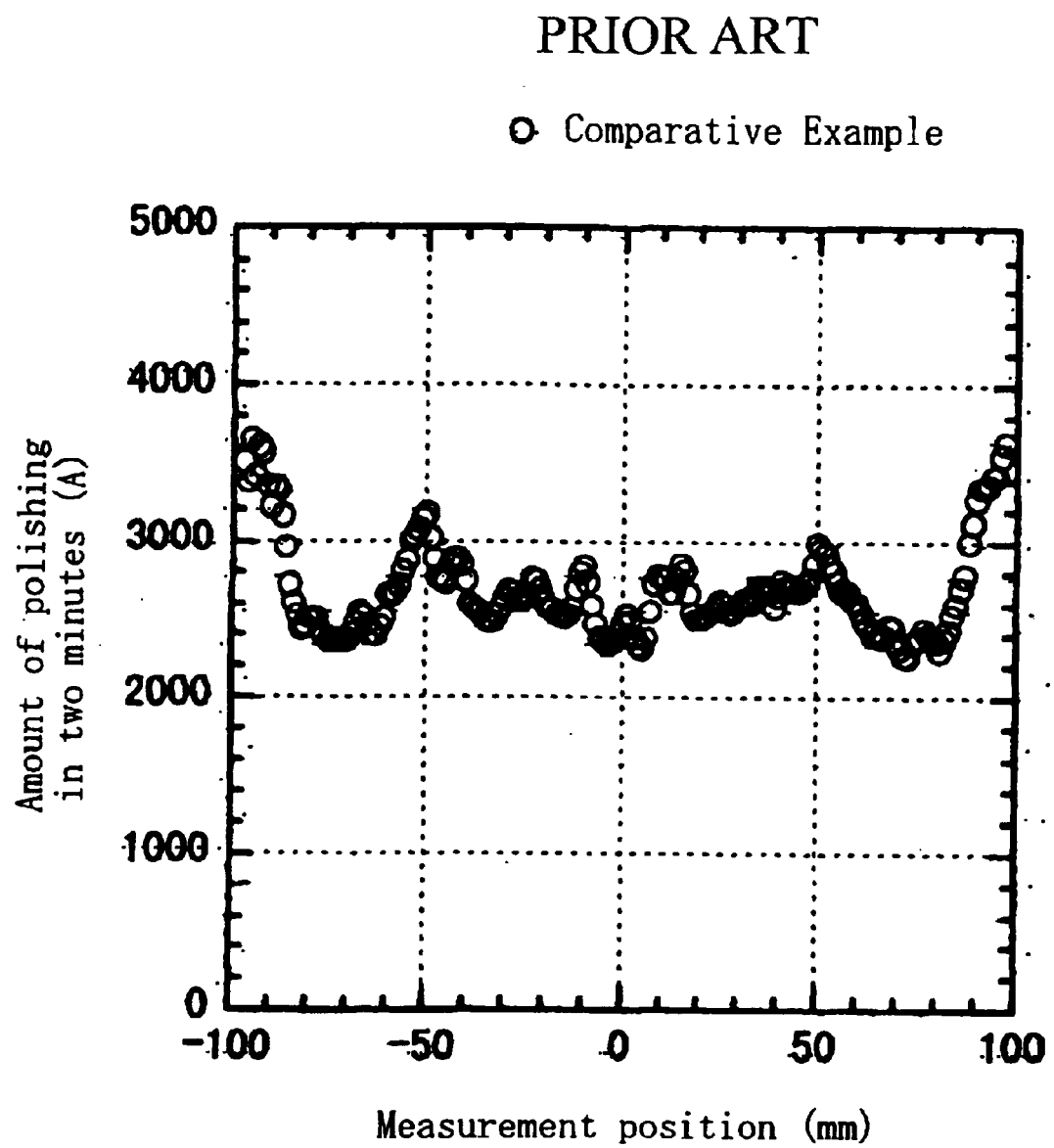
FIG. 9 is a graph showing the resultant of polishing a wafer in the prior art.

FIG. 9 shows the result in which the polishing was performed with the swinging pattern as the one shown in FIG. 8 using the polishing pad shown in FIG. 5(b). When the amount of polishing (in angstroms) in FIG. 7 and FIG. 9 are compared, it is seen that the fluctuations in the polishing amount are increased in FIG. 9, which constitutes prior art. The reason for this is that the variable speed of swinging does not effectively act that the outer circumferential part of the wafer, so that the polishing speed is high at the periphery of the wafer. The polishing uniformity (σ) was 17.3%.

(Embodiment 2)

Figure 10:
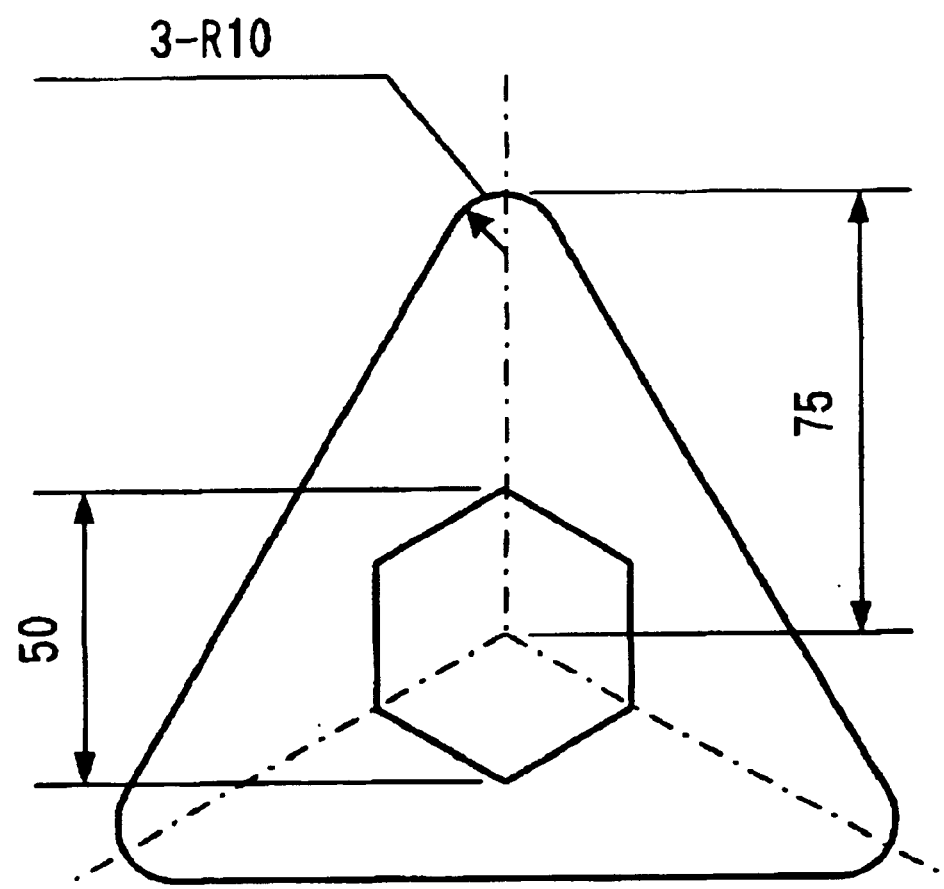
FIG. 10 is a diagram illustrating the polishing pad in the second embodiment of the present invention.

It is apparent from FIG. 7 that polishing was uneven in the area that is 50 mm from the center of the wafer. This is the effect of the bored part having a diameter of 50 mm in the pad in FIG. 5(a). Specifically, the edge of the hole is located in the position that is 25 mm from the center of the pad, so that a discontinuous part appears in this area, which affects this creation of uneven parts. In order to avoid this, a polishing pad was created in which the central bored part has a regular hexagonal shape as shown in FIG. 10, and the remaining shape is the same as the pad shown in FIG. 5(a), and polishing was performed under the same swing conditions as those shown in FIG. 6. The polishing conditions were the same as in Embodiment 1.

Figure 11:
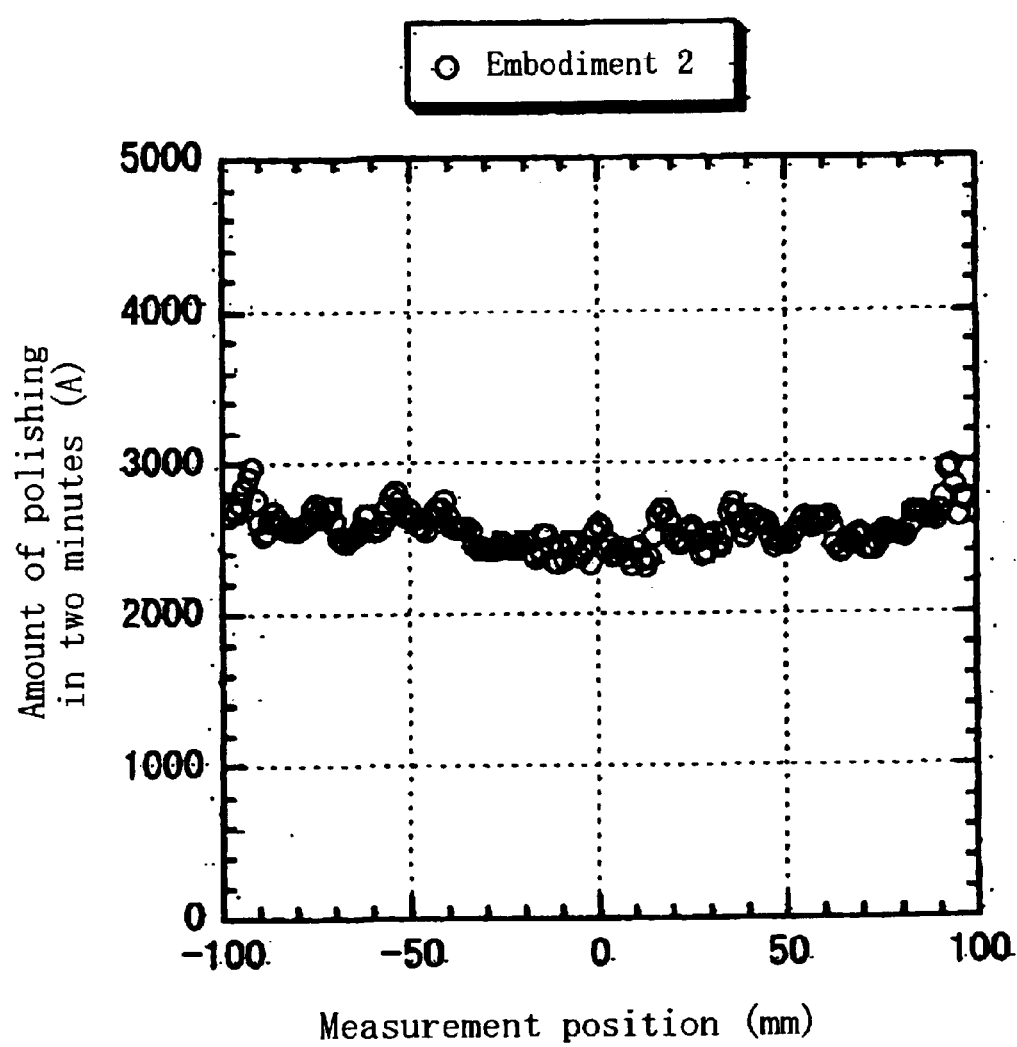
FIG. 11 is a graph showing the result of polishing a wafer in the second embodiment of the present invention.

The result is shown in FIG. 11. According to FIG. 11, the uneven area of polishing that is seen in the vicinity of 50 mm from the center of the wafer as observed in FIG. 7 is eliminated. The polishing uniformity (σ) was 6.3%. The reason for this is considered as follows: specifically, as a result of the central bored part being created as a regular hexagonal shape, the distance from the center of rotation to the boundary between the bored part and non-bored part changes along with the rotation of the pad, so that the area at this boundary is smoothed. Accordingly, if the shape of this bored part is a shape other than a circle, the same effect is obtained. From a similar point of view, if the center of the bored part is shifted from the center of rotation of the pad, the same effect is also obtained.

(Embodiment 3)

Figure 12:
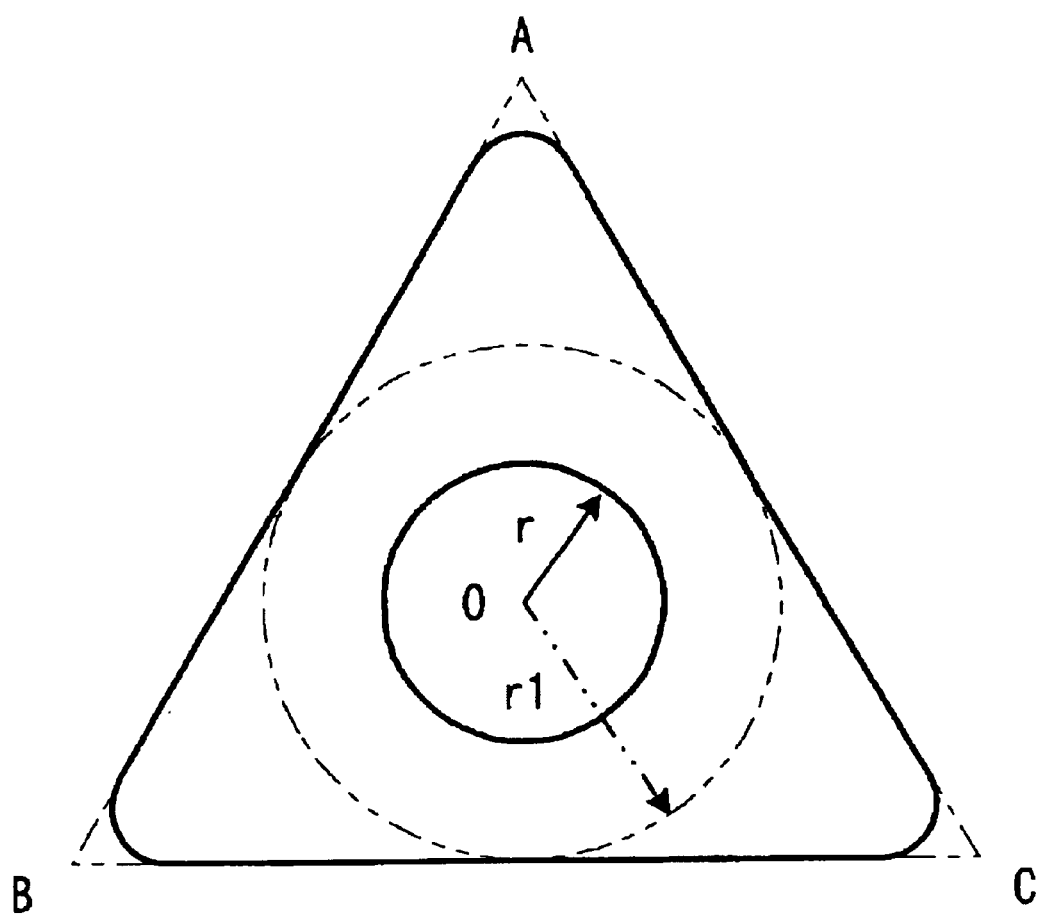
FIG. 12 is a diagram illustrating the polishing pad in the third embodiment of the present invention.

FIG. 12 is a plan view of the polishing pad constituting the third embodiment of the present invention. This polishing pad has a similar construction to the pad shown in FIG. 5(a), in which a circular bored part is provided in the central part of an equilateral triangle that has rounded corners. When the radius of this circular bored part is r, this polishing pad is designed so that the length of the portion that is r1 away from the center O of this polishing pad (i.e., on the circumference with a radius of r1) and contributes to the polishing is within the range of 0.5 πr to 4 πr.

In the case of FIG. 12, when the circle with a radius of r1 internally contacts the equilateral triangle, the length of the portion on this circumference that contributes to the polishing is maximum. Accordingly, the bored part may be designed so that the radius of the internally contacted circle is twice or less of the radius of the bored part.

In the portion where the radius is larger than the radius of the internally contacted circle, the length of the portion that does not touch the polishing pad is increased as the radius becomes larger, so that the length of the portion that contributes to the polishing is reduced. Accordingly, in cases where the radius is increased up to the areas excluding the portions that are located within 5 mm of the end parts, i.e., of the vertices A, B and C of the equilateral triangle created by extending the lines forming the edge portions of the polishing pad (sides of the triangle), the polishing pad may be designed so that the length of the portion that contributes to the polishing in this range is 0.5 $\pi$r or more.

(Embodiment 4)

Figure 13:
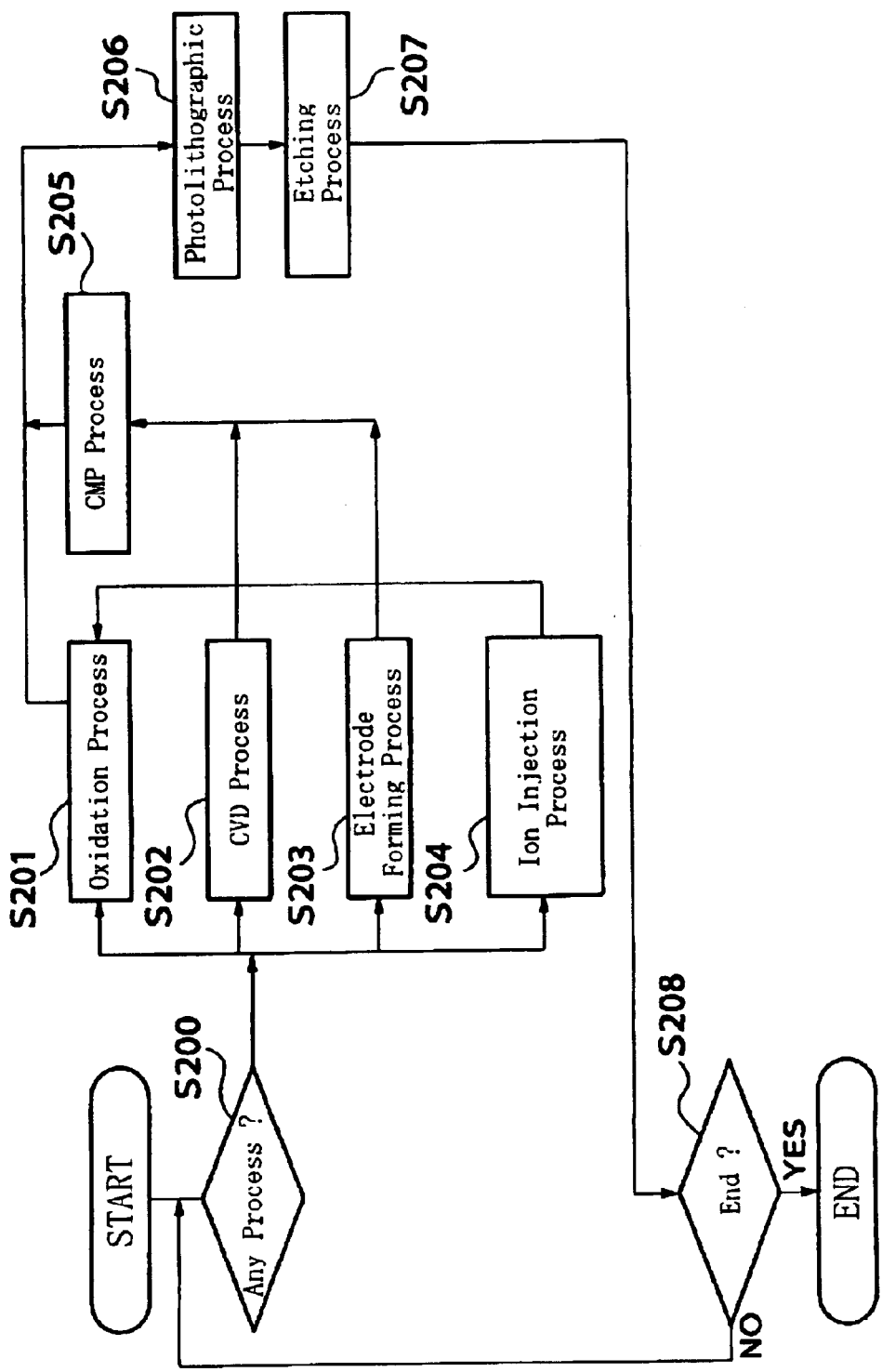
FIG. 13 is a flow chart illustrating the semiconductor device manufacturing process.

FIG. 13 is a flow chart which illustrates the semiconductor device manufacturing process. The semiconductor device manufacturing process is started, and in step S200, an appropriate processing step is first selected from steps S201 through S204 described below. The processing then proceeds to one of steps S201 through S204 in accordance with this selection.

Step S201 is an oxidation process in which the surface of the silicon wafer is oxidized. Step S202 is a CVD process in which an insulating film is formed on the surface of the silicon wafer by CVD, etc. Step S203 is an electrode formation process in which electrodes are formed on the silicon wafer by a process such as vacuum evaporation. Step S204 is an ion injection process in which ions are injected into the silicon wafer.

Following the CVD process or electrode formation process, the processing proceeds to step S205. Step S205 is a CMP process. In this CMP process, planarization of the interlayer insulating film or the formation of a damascene, etc., by polishing of the metal film on the surface of the semiconductor device is performed using the CMP apparatus of the present invention.

Following the CMP process or oxidation process, the processing proceeds to step S206. Step S206 is a photolithographic process. In this photolithographic process, coating of the silicon wafer with a resist, burning of a circuit pattern onto the silicon wafer by exposure using an exposure apparatus, and development of the exposed silicon wafer, are performed. Furthermore, the next step S207 is an etching process in which portions other than the developed resist image are removed by etching, and the resist is then stripped so that the resist that has become unnecessary following the completion of etching is removed.

Next, in step S208, a judgement is made as to whether or not all of the required processes have been completed. If the required processes have not been completed, the processing returns to step S200, and the previous steps are repeated, so that a circuit pattern is formed on the silicon wafer. When it is judged in step S208 that all of the processes have been completed, the working process is ended.

In the semiconductor device manufacturing method of the present invention, the CMP apparatus of the present invention is used in the CMP process; accordingly, the uniformity of polishing in the CMP process is increased. As a result, the present invention has the following effect: namely semiconductor devices that have fine patterns can be manufactured at a lower cost than is possible in conventional semiconductor device manufacturing methods.

Furthermore, the CMP apparatus of the present invention may also be used in the CMP process of semiconductor device manufacturing processes other than the semiconductor device manufacturing process described above.

INDUSTRIAL APPLICABILITY

As was described above, the CMP apparatus of the present invention can be used for polishing the surface of a wafer, for example, in semiconductor device manufacturing processes. Furthermore, the semiconductor device manufacturing method of the present invention can be employed for manufacturing semiconductor devices that have high degree of pattern density.

What is claimed is:

1. A CMP (chemical mechanical polishing) apparatus which polishes an object by pressing a polishing pad against the object and by swinging the polishing pad while rotating both the object and the polishing pad so that relative movement occurs between the polishing pad and the object, wherein the CMP apparatus comprises:

a polishing pad having a width that is smaller than the diameter of the object, and having an outer circumferential portion shaped so that a contact time between the polishing pad and a peripheral portion of the object is lessened, and whose shape is such that in all points on a surface of the object, a product of three values—i.e., an integrated value of a relative linear velocity, an integrated value of a pressure, and an integrated value of the contact time between the polishing pad and the object during polishing, is within +30% of the mean value of the product of the three integrated values at all points on the surface of the object.

2. The CMP apparatus described in claim 1, wherein at least one bored part is provided in the polishing pad.

3. The CMP apparatus described in claim 2, wherein the area of the bored part is 80% or less of the total area of the polishing pad.

4. The CMP apparatus described in claim 2, wherein a mechanism for supplying a slurry from the polishing pad is provided.

5. The CMP apparatus described in claim 2, wherein the bored part is a shape other than a circle.

6. The CMP apparatus described in claim 1, wherein a circular bored part is provided in the center of the polishing pad, and when the radius of the circular bored part is r, and a length of the an effective part of the polishing pad at a specified distance from the center of the polishing pad is in the range of 0.5 $\pi$r to 4 $\pi$r, excluding end parts of the polishing pad, no complex swinging is required.

7. The CMP apparatus described in any one of claims 1 through 6, wherein the center of the polishing pad and the center of the surface plate to which the polishing pad is pasted are offset.

* * * * *